United States Patent [19]
Arques et al.

[11] Patent Number: 4,743,751
[45] Date of Patent: May 10, 1988

[54] DEVICE FOR THE OPTICAL ABUTMENT OF PHOTOSENSITIVE DETECTORS

[75] Inventors: Marc Arques, Grenoble; Jean P. Moy, St. Egreve, both of France

[73] Assignee: Thomson-CSF, Paris, France

[21] Appl. No.: 852,715

[22] Filed: Apr. 16, 1986

[30] Foreign Application Priority Data

Apr. 30, 1985 [FR] France ................................ 85 06570

[51] Int. Cl.[4] .............................................. H01J 40/14
[52] U.S. Cl. .................................. 250/211 R; 250/578
[58] Field of Search ................ 250/216, 211 R, 211 J, 250/208, 209, 578, 345, 344, 349, 204; 358/212, 213, 293, 294; 357/24 LR

[56] References Cited

U.S. PATENT DOCUMENTS

| | | | |
|---|---|---|---|
| 4,005,285 | 1/1977 | Price | 250/208 |
| 4,053,773 | 10/1977 | Deresh et al. | 250/349 |
| 4,200,788 | 4/1980 | Agulnek | 250/578 |

*Primary Examiner*—David C. Nelms
*Attorney, Agent, or Firm*—Cushman, Darby & Cushman

[57] ABSTRACT

A device for the optical abutment of photosensitive detectors using an optical system comprising two prisms joined together by a semireflecting face. The detectors are disposed on two right angle faces each belonging to a prism. The arrangement of the strips of detectors is such that they are as close as possible to each other and that the junction of two strips on one of the faces does not correspond to the junction of two strips on the other face. Means provide summation of the information from two detectors, situated on each of the two faces and receiving the same signal.

12 Claims, 2 Drawing Sheets

FIG_1 (PRIOR ART)
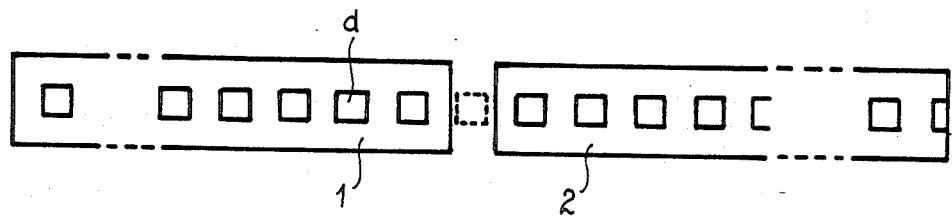
FIG_2 (PRIOR ART)
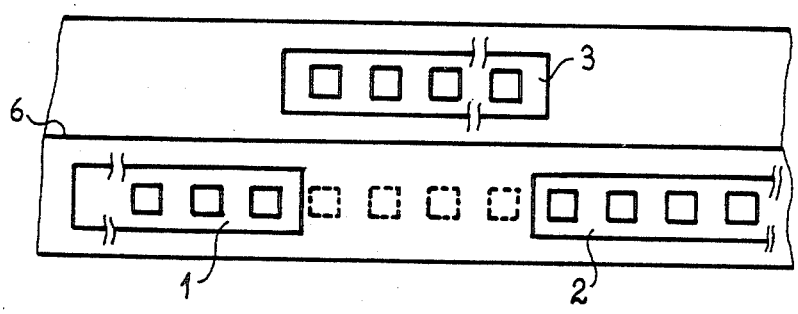
FIG_3 (PRIOR ART)
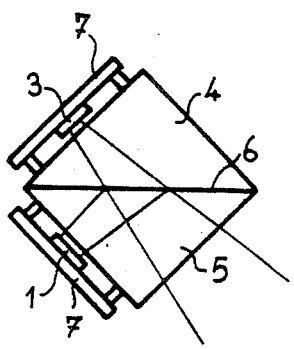

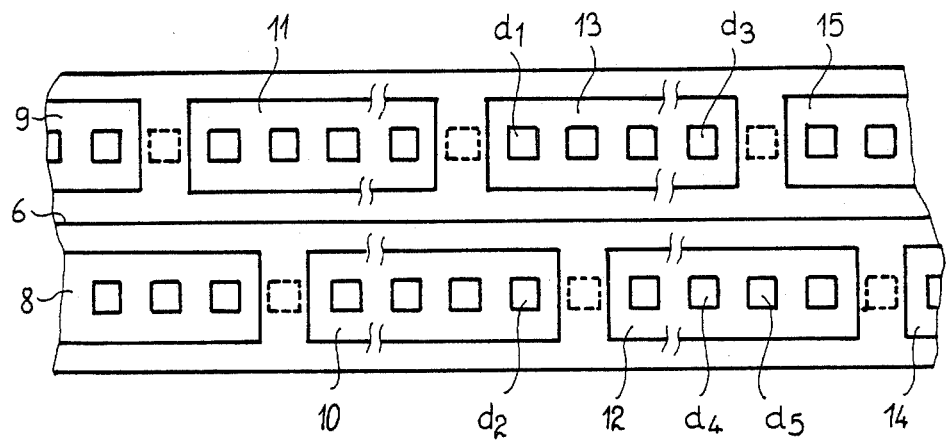
FIG_4
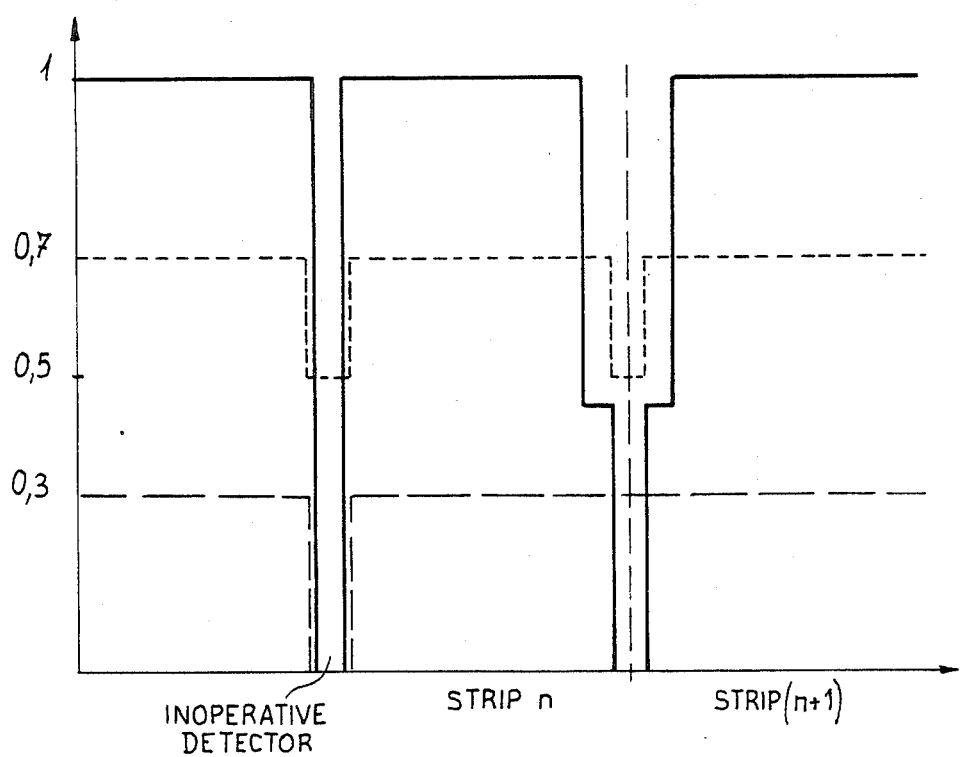
FIG_5

DEVICE FOR THE OPTICAL ABUTMENT OF PHOTOSENSITIVE DETECTORS

BACKGROUND OF THE INVENTION

1. Field of the Invention

The present invention relates to a device for the optical abutment of photosensitive detectors disposed in the form of strips.

In some fields, such for example as taking pictures of the earth by satellite, alignments are required of a large number of photosensitive detectors, for example 10,000 detectors, the detectors must be positioned very accurately, with a pitch of a few tens of micrometers for example. To form these lines of detectors, strips are provided comprising a limited number of detectors which is about 2000 in the case of silicon detectors and a few hundreds only in the case of detectors formed on ternary or quaternary semiconductors, having as formula for example Hg Cd Te or Ga In As P.

2. Description of the Prior Art

For forming these lines of detectors it is known to place a sufficient number of strips end to end.

In the prior art this abutment is provided optically or mechanically.

Mechanical abutment consists of bonding strips to a substrate while respecting the pitch of the detectors as is shown in FIG. 1.

In FIG. 1, two strips 1 and 2 are placed end to end. They carry detectors referenced d.

Mechanical abutment has in particular the following disadvantages:

it is difficult to obtain for it requires accurate positioning of the strips on their support, in so far as their alignment is concerned and respecting the pitch between detectors of two adjacent strips;

at the junction of two strips, it frequently happens that at least one detector is missing and that the detectors adjacent the edges are damaged;

finally, when a strip carries a detector which is not operating, the signal to noise ratio is zero for this detector.

Optical abutment, such as it is known in the prior art, requires the use of an optical system formed of two identical prisms joined side by side by a semireflecting face.

This system is derived from the well known "Lummer's cube" which is used for separating a convergent beam into two beams, without introducing astigmatism. In the case of optical abutment, the optical system used is not a cube but a parallelepiped, for it must be possible to align the strips of the detectors on two of its faces.

FIG. 3 shows a side view of this optical system with the two prisms 4 and 5 joined together by their semireflecting face 6. The strips of detectors 1 and 3 are disposed on two right angle faces each belonging to a different prism. They are carried by a support 7.

In FIG. 2 this system is shown in a front view. In this view, the two faces of the prisms are shown carrying the strips referenced 1, 2, 3.

As is shown in FIG. 3, the optical system splits up the image to be analyzed, through its semireflecting face 6.

The strips carried by one of the faces of the system receive the image after reflection from the semireflecting face 6 and the strips carried by the other faces of the system receive the same image transmitted by the semireflecting face 6.

FIG. 2 shows how the strips 1, 2, 3 ... are disposed.

One of the faces carries the strips of even rank and the other those of uneven rank. The strips are disposed symmetrically with respect to the semireflecting face 6.

As is illustrated in FIG. 2, between two strips disposed on the same face, a gap is left corresponding substantially to a strip disposed on the other face. Thus, in FIG. 2, between strips 1 and 2 a gap is left corresponding to the strip 3 carried by the other face. In the example chosen, strips 1 and 2 receive the image by reflection and strip 3 receives the image by transmission. The abutment of the strips is thus provided optically.

The known optical abutment of the prior art has the essential drawback of having a low signal to noise ratio because of the semireflecting layer.

The loss of brightness caused by this layer is at least equal to a factor 2. In fact, this loss is often much higher and equal to a factor of 3 to 4.

In fact, it is generally desired to provide radiometric functions, i.e. to know accurately the spectral reflectivity characteristics of the received image. The detectors then operate in a fairly wide spectral range and with variable incident polarization.

For the reflection and transmission coefficients to be equal, even with variable incident polarization, a metal semireflecting layer must be used having a nickel or chromium basis for example. The optical balance of these layers is for example as follows: 30% of the signal is transmitted, 30% of the signal is reflected and 40% of the signal is absorbed.

With respect to mechanical abutment in which it is assumed that the signal to noise ratio is equal to 1, the signal to noise ratio in the case of optical abutment, for the same detector technology, is only about 0.3.

As for the case of mechanical abutment, in the prior art optical abutment the presence of a defective detector in a strip results in a zero signal to noise ratio.

With respect to mechanical abutment, the optical abutment of the prior art generally causes no disturbance to the junction of the strips. There are generally no missing points at the junction of the strips, and the points adjacent the edges of the strips are not damaged.

The present invention relates to a device for the optical abutment of photosensitive detectors which, while keeping the essential advantages of the known prior art optical abutment device has additional advantages in that the signal to noise ratio is which is much higher going from 0.3 to about 0.7. And signal to noise ratio equal to about 0.5 is obtained in the case of an inoperative detector. Thus an accidental dead point in a strip does not result in a blind point in the reconstituted line of detectors, but only in a point having a lower signal to noise ratio, provided that the presence of this inoperative detector has been detected. This correction is particularly interesting in the case of infrared detectors which use semiconductors where isolated defects are more frequent than in silicon, and for which the efficiency in manufacturing these strips is very low.

Moreover, the optical abutment device of the invention has a redundancy of detectors which is a great asset in space applications.

SUMMARY OF THE INVENTION

The present invention relates to a device for the optical abutment of photosensitive detectors, disposed in the form of strips, comprising two prisms joined together to form a semireflecting face, the detectors being disposed on two right angle faces, each belonging to a prism, wherein:

there is at least one alignment of strips on each of the faces, these strips being as close as possible to each other and disposed so that the junction of two strips on one of the faces does not correspond to the junction of two strips on the other face;

means for adding of the signals coming from the two detectors, situated on each of the two faces, and having received the same signal.

BRIEF DESCRIPTION OF THE DRAWINGS

Other objects, features and results of the invention will be clear from the following description, given as a of non limiting example and illustrated by the accompanying Figures which show:

FIG. 1 is a diagram illustrating a mechanical abutment device of the prior art;

FIGS. 2 and 3 are diagrams illustrating an optical abutment device of the prior art;

FIG. 4 is a diagram illustrating an optical abutment device of the invention; and FIG. 5 is a comparative table of the different abutment devices discussed in this patent in so far as the signal to noise ratio is concerned.

In the different Figures, the same references designate the same elements but, for the sake of clarity, the sizes and proportions of the different elements are not respected.

DESCRIPTION OF THE PREFERRED EMBODIMENTS

FIG. 4 illustrates the optical abutment device of the invention.

As in the known optical abutment device, two prisms are again used joined together by a semireflecting face. The strips of detectors are again disposed on two right angle faces, each belonging to a prism, but the arrangement of the strips is different as is illustrated in FIG. 4.

In accordance with the invention, the strips are as close as possible to each other. They are positioned so that the junction of two strips on one of the faces of the prism does not correspond with the junction of two strips on the other face.

In FIG. 4, by way of example, between two consecutive strips carried by the same face there is a space corresponding to a single detector shown by a broken line.

As in the prior art, the strips are disposed symmetrically with respect to the semireflecting face 6.

Each detector d supplies a charge amount proportional to the lighting received. Reading means read each detector sequentially. These means are generally formed by a charge transfer device comprising a multiplexer.

In accordance with the invention, means for adding the signals from the two detectors, situated on each of the two faces and having received the same signal.

The signals from two detectors which are superimposed in FIG. 4, for example detectors $d_1$ and $d_2$, are added either in analog fashion at the output of the multiplexers, or by calculation after being stored.

In accordance with the invention, it is not necessary as in the prior art for the semireflecting layer 6 to have a transmission strictly equal to its reflection since the reflected and transmitted signals are added. Thus a multidielectric layer without absorption may be used and a response equivalent to that of a single detector may be obtained after addition of the reflected and transmitted signals.

The noise corresponding to each point of the alignment of detectors which the invention allows to be reconstructed fictitiously is multiplied by $\sqrt{2}$, since the two detectors corresponding to each point are substantially identical and since their uncorrelated noises are simply added quadratically.

According to the invention, the signal to noise ratio is degraded by a factor of $\sqrt{2}$ whereas it is degraded by a factor of 3 to 4 in the case of the known prior art optical abutment.

In FIG. 5, the evolution of the signal to noise ratio has been shown in the case of mechanical abutment as a continuous line. In the case of the prior art optical abutment as a broken line is used and in the case of the optical abutment of the invention a dotted line is used.

According to the invention, the signal to noise ratio is therefore situated at about 0.7, whereas for the same detector technology it is equal to 1 for mechanical abutment and to 0.3 for the prior art optical abutment.

In the case of an inoperative detector, whether it is a result of a manufacturing defect or of a defect occurring subsequently, the invention allows a signal to noise ratio of about 0.5 to be obtained.

For known abutment devices, in the case of an inoperative detector, the signal to noise ratio is zero, as is illustrated in FIG. 5.

In accordance with the invention, if a detector is not operating, the detector with which it is associated will however supply a signal. The signal to noise ratio is then substantially equal to 0.5. Of course the inoperative detector should not be taken into account for summation of the signals.

This operation of locating the inoperative detector does not substantially complicate the operation of the device because the signal delivered by each detector is modified by a correction coefficient related to the detector, and to the defects of the optical system . . . , and which requires each detector to be examined successively for determining this correction factor. During this operation, it may be determined which detectors are not operating.

At the junction between two strips, for example strips n and n+1, it is shown in FIG. 5 that, in the case of mechanical abutment, there were missing points for which the signal to noise ratio is zero and that the neighbouring points could be damaged and have a degraded signal to noise ratio.

In the case of the optical abutment of the prior art, there is generally no deterioration of the signal to noise ratio at the junction of two strips;

In the case of the invention, at the junction between two successive strips, there is at least one point which corresponds to only one detector.

Thus in FIG. 4, the detector $d_5$ will alone supply a signal for it corresponds to the junction of two strips carried by the other face of the optical system.

At the junction between the two strips, since a single detector is used which only receives half of the signal, the signal to noise ratio is substantially of the order of 0.5.

In the case of infrared detectors of the BLIP type— background limited infrared photodetector—there is practically no increase in noise because the signals from the two detectors are summed because the noise comes from the radiation received and not from the detectors themselves.

The signal to noise ratio is therefore substantially equal to 1.

Of course the invention may be used if it is desired to reconstruct several lines of detectors, and not a single line. In this case each face of the optical system used carries several alignments of detector strips. The optical abutment device of the invention is therefore applicable to all sorts of mono or bidimensional detector mosaics.

What is claimed is:

1. A device for the optical abutment of strips of photosensitive detectors comprising:

two prisms joined together to form a semireflecting face therebetween and two external faces;

at least two strips of photosensitive detectors mounted on an external face of each prism extending at right angles to one another for producing outputs corresponding to incident illumination, said strips having a given minimal length and being separated from the adjacent strip by a gap much smaller than said minimal length, the strips on one of the external faces being displaced in relation to the strips on the other external face so that the gap on one face is located in front of a portion of the strip on the other face, and the gap on the other face is located in front of a portion of the strip of said one face;

means for adding the signals from the two detectors mounted on different prisms disposed one above the other.

2. The device as claimed in claim 1, wherein each of said two faces carries several junctions of detector strips.

3. The device as claimed in claim 1, further including reading means for sequentially reading said detectors on each face including, a charge transfer device and a multiplexer.

4. The device as claimed in claim 2, further including reading means, for sequentially reading said detectors on each face including a charge transfer device and a multiplexer.

5. The device as claimed in claim 4, wherein the adding means further includes analog adding means at the output of the multiplexers of the reading means to add the signals in an analog fashion.

6. A device as in claim 3 wherein said adding means includes an analog summation means at the output of the multiplexers of the reading means for adding the signals in an analog fashion.

7. A device as in claim 1 further including a storage means for storing said signals prior to addition thereof.

8. A device as in claim 2 further including a storage means for storing said signals prior to addition thereof.

9. A device as in claim 3 further including a storage means for storing said signals prior to addition thereof.

10. A device as in claim 6 further including a storage means for storing the signals prior to summation thereof.

11. A device as in claim 4 further including a storage means for storing the signals prior to summation thereof.

12. A device as in claim 5 further including a storage means for storing the signals prior to summation thereof.

* * * * *